US010088238B2

(12) United States Patent
Shedd (10) Patent No.: US 10,088,238 B2
(45) Date of Patent: Oct. 2, 2018

(54) HIGH EFFICIENCY THERMAL MANAGEMENT SYSTEM

(71) Applicant: Wisconsin Alumni Research Foundation, Madison, WI (US)

(72) Inventor: Timothy A. Shedd, Middleton, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 337 days.

(21) Appl. No.: 14/709,096

(22) Filed: May 11, 2015

(65) Prior Publication Data
US 2016/0033204 A1 Feb. 4, 2016

Related U.S. Application Data (63) Continuation of application No. 13/169,377, filed on Jun. 27, 2011, now abandoned.

(51) Int. Cl.
*F25D 17/02* (2006.01)
*F25D 23/12* (2006.01)
(Continued)

(52) U.S. Cl.
CPC ............... *F28C 3/08* (2013.01); *F28D 15/00* (2013.01); *H01L 23/427* (2013.01); *H01L 23/4735* (2013.01); *H01L 2924/0002* (2013.01)

(58) Field of Classification Search
CPC . H01L 23/427; H01L 23/4735; H01L 23/473; H01L 2924/00; H01L 2924/0002;
(Continued)

(56) References Cited

U.S. PATENT DOCUMENTS 4,312,012 A 1/1982 Frieser et al.
4,434,625 A 3/1984 Cree
(Continued)

OTHER PUBLICATIONS

Anandan et al., "Thermal Management of Electronics: A Review of Literature", Thermal Science, vol. 12, No. 2, pp. 5-26, 2008.
(Continued)

*Primary Examiner* — Joseph Trpisovsky
(74) *Attorney, Agent, or Firm* — Boyle Fredrickson, S.C.

(57) ABSTRACT

Disclosed are methods and apparatuses for cooling a work piece surface using two-phase impingement, such as direct jet impingement. Preferred method include flowing a coolant through a chamber comprising a surface to be cooled by projecting a jet stream of coolant against the surface while maintaining pressure in the chamber to permit at least a portion of coolant contacting the surface to boil. Preferred apparatuses include a chamber comprising the surface and tubular nozzles configured to project a stream of coolant against the surface, a pump for forcing coolant through the tubular nozzles, a pressurizer for maintaining an appropriate pressure in the chamber, and a heat exchanger for cooling the coolant exiting the chamber. The apparatuses may further include a pressure regulator for detecting changes in temperature of the coolant exiting the chamber and communicating with the pressurizer to adjust the maintained pressure accordingly. The methods and apparatuses disclosed herein provide for effective and efficient cooling or work piece surfaces.

11 Claims, 4 Drawing Sheets

(51) Int. Cl.
*F25D 25/00* (2006.01)
*F28C 3/08* (2006.01)
*H01L 23/427* (2006.01)
*H01L 23/473* (2006.01)
*F28D 15/00* (2006.01)

(58) Field of Classification Search
CPC ............ G06F 2200/201; H05K 7/2029; H05K 7/20345; H05K 7/20381; F28D 15/02; F28D 15/0266; F28D 15/00; F28D 15/06; F28C 3/08
USPC .................. 62/259.2, 115, 474, 512, 64, 62
See application file for complete search history.

(56) References Cited

U.S. PATENT DOCUMENTS

| | | | |
|---|---|---|---|
| 4,704,167 A | 11/1987 | Ichida et al. | |
| 4,705,102 A | 11/1987 | Kanda et al. | |
| 4,750,086 A | 6/1988 | Mittal | |
| 4,783,721 A | 11/1988 | Yamamoto et al. | |
| 4,866,570 A | 9/1989 | Porter | |
| 4,977,444 A | 12/1990 | Nakajma et al. | |
| 5,021,924 A | 6/1991 | Kieda et al. | |
| 5,050,037 A | 9/1991 | Yamamoto et al. | |
| 5,270,572 A | 12/1993 | Nakajma et al. | |
| 5,285,351 A | 2/1994 | Ikeda | |
| 5,316,075 A | 5/1994 | Quon et al. | |
| 5,349,831 A | 9/1994 | Daikoku et al. | |
| 5,391,052 A | 2/1995 | Correia et al. | |
| 5,463,528 A | 10/1995 | Umenawa | |
| 5,491,363 A | 2/1996 | Yoshikawa | |
| 5,522,452 A | 6/1996 | Mizuno et al. | |
| 5,697,169 A * | 12/1997 | Jacob .................. | B21B 45/0233 134/199 |
| 5,999,404 A | 12/1999 | Hileman | |
| 6,034,872 A | 3/2000 | Chrysler et al. | |
| 6,143,343 A * | 11/2000 | Wilson .................. | A22C 29/04 426/506 |
| 6,152,215 A | 11/2000 | Niggemann | |
| 6,431,260 B1 | 8/2002 | Agonafer et al. | |
| 6,498,725 B2 | 12/2002 | Cole et al. | |
| 6,519,955 B2 | 2/2003 | Marsala | |
| 6,571,569 B1 | 6/2003 | Rini et al. | |
| 6,637,231 B1 | 10/2003 | Monfarad | |
| 6,827,135 B1 | 12/2004 | Kramer et al. | |
| 6,953,227 B2 | 10/2005 | Dunn et al. | |
| 6,993,926 B2 | 2/2006 | Rini et al. | |
| 7,061,763 B2 | 6/2006 | Rsoi | |
| 7,100,381 B2 | 9/2006 | Hale et al. | |
| 7,143,815 B2 | 12/2006 | Lee et al. | |
| 7,143,816 B1 | 12/2006 | Ghosh et al. | |
| 7,264,042 B1 | 9/2007 | Tilton et al. | |
| 7,607,475 B2 | 10/2009 | Weber | |
| 7,757,497 B1 | 7/2010 | Pautsch et al. | |
| 2001/0002541 A1 | 6/2001 | Patel et al. | |
| 2005/0262861 A1 | 12/2005 | Weber et al. | |
| 2006/0196627 A1 | 9/2006 | Shedd et al. | |
| 2006/0242978 A1 | 11/2006 | Hsu et al. | |
| 2007/0028960 A1 | 2/2007 | Royne et al. | |
| 2007/0044493 A1 | 3/2007 | Kearney et al. | |
| 2007/0095087 A1 | 5/2007 | Wilson et al. | |
| 2007/0193300 A1 * | 8/2007 | Tilton .................... | F25B 43/04 62/475 |
| 2007/0230126 A1 * | 10/2007 | Pautsch ............... | H01L 23/4735 361/699 |

OTHER PUBLICATIONS

Esposito et al., "Novel Jet Impingement Cooling Geometry for Combustor Liner Backside Cooling", Journal of Thermal Science and Engineering Applications, vol. 1, pp. 021001-1/021001-8, 2009.

Hardcore, "Liquidblade (TM) a Revolution in Data Center Design", Total Cost of Ownership Analysis, 12 pages.

Lee et al., "Implementation of Microchannel Evaporator for High-Heat-Flux Refrigeration Cooling Applications", Transactions of the ASME, vol. 128, pp. 30-37, 2006.

Marcinichen et al. "Refrigerated Cooling of Microprocessors with Micro-Evaporation New Novel Two-Phase Cooling Cycles: A Green Steady-State Simulation Code", Proceedings of ENCIT, 12 pages, 2010.

Marcinichen et al., "Reasons to Use Two-Phase Refrigerant Cooling", http://www.electronics-cooling.com/2011/03/reasons-to-use-two-ph...rce_newsletter03_22&utm_medium-email&utm_campaign=EC_eNews_03_22, 2011.

Narumanchi et al., "Modeling Single-Phase and Boiling Liquid Jet Impingement Cooling in Power Electronics", NREL National Renewable Energy Laboratory, Technical Report NREL/TP-540-38787, 71 pages, 2005.

Narumanchi et al., Numerical Simulations of Boiling Jet Impingement Cooling in Power Electronics, NREL National Renewable Energy Laboratory, Conference Paper NREL/CP-540-39401, 14 pages, 2006.

Oh et al., "Liquid Jet-Array Cooling Modules for High Heat Fluxes", AIChE Journal: vol. 44, No. 4, pp. 769-779, 1998.

Oliver et al., "Two-phase cooling of Datacenters: Reduction in Energy Costs and improved Efficiencies", Proceeding of ENCIT 2010, 13 pages, 2010.

Schmidt et al., "High-end server low-temperature cooling", IBM J.Res. & Dev., vol. 46, No. 6, pp. 739-751, 2002.

Zuckerman et al., "Jet Impingement Heat Transfer: Physics, Correlations, and Numerical Modeling", Advances in Heat Transfer, col. 39, ISSN 0065-2717, pp. 565-634, 2006.

* cited by examiner

HIGH EFFICIENCY THERMAL MANAGEMENT SYSTEM

CROSS-REFERENCE TO RELATED APPLICATION

This application is a continuation of application Ser. No. 13/169,377, filed Jun. 27, 2011.

STATEMENT REGARDING FEDERALLY SPONSORED RESEARCH

This invention was made with government support under NOOO 14-09-D-0738 awarded by the NAVY/ONR. The government has certain rights in the invention.

FIELD OF THE INVENTION

The present invention is directed to methods and apparatuses for cooling work pieces such as processors or other electronic devices.

BACKGROUND

Methods for maintaining electronic devices within a safe and desirable operating temperature range have been a topic of research since the invention of the transistor. Maintaining such a temperature range is a challenging problem that is only increasing in importance and difficulty as semiconductor technology continues to progress. State of the art microprocessors easily produce more than 40 W of thermal energy per square centimeter of the microchip surface. Power electronics can attain heat densities three times this level.

In addition to the requirement to manage such high heat intensity, there is a need to remove the thermal energy efficiently, both in terms of energy expended and space required. According to the Department of Energy, approximately 3% of electricity used in the United States is devoted to powering data centers or computer facilities. Approximately half of this electricity goes toward power conditioning and cooling. Increasing the efficiency of cooling would lead to dramatic savings in energy. More efficient cooling is also needed in transportation systems due to the rapidly increased adoption of hybrid and electric vehicles. More efficient cooling of the electronic systems in these vehicles translates into increased range and utility of the vehicles.

The majority of computer systems are currently cooled using air that is forced through a series of extended metal surfaces coupled to microchips or other electronic work pieces. However, these systems are inherently limited in terms of their performance and efficiency. Due to the very low volumetric heat capacity of air, a large volume of air flow is required to remove the heat load of even one processor. A recommended value is 5 to 10 cubic feet per minute (cfm) per 100 W of heat load. This equates to the equivalent of two air conditioning systems sized for a typical U.S. house being required to cool a rack of computers. A typical data center may have several hundred of these racks.

Furthermore, air-cooled systems are not only inefficient in themselves but also cause the electronics they cool to operate less efficiently. Because of the low thermal capacity of air, fully utilized microprocessors operate at or near the maximum rated temperature. Reducing the temperature of microprocessors can save at least 25% of the energy they consume at the same level of utilization.

Numerous liquid cooling schemes have been implemented to address some of the problems associated with air cooling. A majority rely on using water that flows through channels defined by fins, wherein the fins are indirectly coupled to a work piece via a metal base plate, a thermal paste, and a direct bond metal such as copper. This approach can be effective. However, the intervening materials between the water and the work piece induce significant thermal resistance, which reduces the efficiency of the system. In addition to the thermal resistance, the intervening materials add to the cost and time of manufacture, constitute additional points of failure, and provide possible disposal issues. Finally, the intervening materials render the system unable to efficiently deal with local hot spots on a work piece. The entire system must be designed to accommodate the maximum anticipated heat load of one or a few localized hot spots.

Further improvements have been made to liquid-cooled systems by using a coolant other than water. Dielectric coolants can come into direct contact with the electronic devices and not harm them. Use of such dielectric coolants permits eliminating a significant amount of thermal interface material from the system. However, the dielectric coolants are less efficient coolants than water. More aggressive cooling techniques are therefore required to achieve the necessary performance.

One approach with dielectric coolants includes direct spray impingement, in which atomized liquid coolant is sprayed directly on a work piece surface through air or vapor. However, spray cooling is limited by several factors. First, spray cooling requires a significant working volume to enable the atomized sprays to form. Second, atomizing the liquid requires a significant amount of pressure upstream of the atomizer to generate an appropriate pressure drop at the atomizer-air interface to enable atomized sprays to form. Maintaining this amount of pressure consumes a significant amount of energy. Third, high flow rates are required to prevent critical heat flux, wherein evaporation of coolant on the surface prevents atomized liquid from reaching the surface. In the end, it has proven difficult to design a practical, compact spray cooling system, despite the large amount of effort that has been expended to do so.

Another approach is to use direct jet impingement, wherein streams of liquid are projected through a liquid medium and impinge directly on a work piece surface. While impinging jets are known to have notable heat transfer performance, impinging jet systems have problems of scalability. To achieve high heat transfer over a large area, arrays of jets must be used. The use of arrays in conventional direct jet impingement systems, however, is problematic. Opposing surface flow of fluid from neighboring jet streams induces stagnant regions on the surface. The heat transfer performance in these stagnant regions can drop to nearly zero. Furthermore, conventional jet impingement systems use nozzles that are part of a large, flat nozzle plate. As fluid from jet streams impinging on the surface flow from the center of the plate flows outward, it can have enough momentum to completely deflect the outermost jets, preventing them from impinging on the heated surface. As a result of these factors, conventional impinging jet systems are limited in size.

Efficient, scalable methods and devices for cooling surfaces of work pieces are needed.

SUMMARY OF THE INVENTION

The present invention is directed to methods and devices for cooling a work piece surface using two-phase, direct impingement, such as direct jet impingement.

One aspect of the invention comprises an apparatus for cooling a surface. A preferred apparatus comprises at least one chamber with the surface exposed therein. The chamber comprises at least one inlet and an outlet and is configured fix flowing fluid therethrough by entering through the inlet in a stream projected against the surface and exiting through the outlet. The apparatus further comprises a pump in fluid communication with the inlet. The pump is configured to project a stream of fluid through the inlet into the chamber and against the surface. The apparatus also comprises a pressurizer in fluid communication with the chamber. The pressurizer is configured to maintain a fluid pressure in the chamber.

The apparatus may further comprise a coolant that fills the chamber and is in contact with the surface. At least a portion of the coolant in contact with the surface has a temperature approximately equal to the saturation temperature of the coolant. The apparatus may also further comprise a heat exchanger in fluid communication with the outlet of the chamber. The heat exchanger is configured to cool fluid exiting from the outlet.

The apparatus may also further comprise a pressure regulator. The pressure regulator preferably includes a device configured to detect the temperature of fluid exiting from the outlet such that the pressure regulator communicates with the pressurizer to adjust the maintained pressure upon a detected change in temperature. In one version, the device is configured to detect the temperature of fluid exiting from the outlet directly. In another version, the device is configured to detect the temperature of fluid exiting from the outlet indirectly, by detecting the temperature of heat-exchanged external cooling fluid used to cool the coolant exiting from the outlet.

The apparatus may further comprise at least a second chamber with a second surface exposed therein. The second chamber comprises a second inlet and a second outlet and is configured for flowing fluid therethrough. The second inlet is in fluid communication with the pump and the second outlet is in fluid communication with the pressurizer.

The inlet of the apparatus preferably comprises at least one tubular nozzle extending into the chamber. The tubular nozzle is configured to project a stream of fluid at the surface. The tubular nozzle is preferably configured to project a stream of fluid having a central axis oriented non-perpendicularly with respect to the surface. The tubular nozzle preferably has a central axis that is collinear with the central axis of the stream of fluid that the tubular nozzle is configured to project.

The inlet of the apparatus preferably comprises an array of tubular nozzles. Each tubular nozzle in the array is preferably configured to project a stream of fluid having a central axis oriented non-perpendicularly with respect to the surface. Each tubular nozzle in the array preferably has a central axis that is collinear with the central axis of each respective stream of fluid that the tubular nozzle is configured to project.

Another aspect of the invention comprises a method of cooling a surface. A preferred method comprises flowing a coolant through a chamber with the surface exposed therein. The coolant is introduced through an inlet of the chamber and drained through an outlet of the chamber. Introducing the coolant through the inlet includes projecting a stream of coolant, preferably a jet stream of coolant, against the surface. The method further comprises maintaining pressure in the chamber wherein at least a portion of liquid coolant in the chamber evaporates.

The method preferably comprises cooling coolant draining from the outlet to below a saturation temperature of coolant in the chamber.

The method may also further comprise detecting temperature of coolant draining from the outlet and adjusting the pressure in the chamber in response to the detected temperature. In one version, the temperature of the coolant exiting from the outlet is detected directly. In another version, the temperature of coolant exiting from the outlet is detected indirectly by detecting the temperature of heat-exchanged external cooling fluid used to cool the coolant exiting from the outlet.

The step of introducing the coolant through the inlet preferably includes forcing the coolant through at least one tubular nozzle that extends into the chamber.

The step of projecting a stream of coolant against the surface preferably includes projecting a stream having a central axis oriented non-perpendicularly with respect to the surface. More preferably, an array of streams is projected against the surface. Each stream in the array preferably has a central axis oriented non-perpendicularly with respect to the surface. Each stream in the array is also preferably projected from a tubular nozzle having a central axis that is collinear with the central axis of the stream.

In a preferred version, coolant contacting the surface flows across the surface in a substantially same direction. The array of streams contact the surface in an array of contact points organized in columns and rows. The columns are oriented perpendicularly with respect to the substantially same direction and the rows are oriented in parallel with respect to the substantially same direction. In this manner, a given contact point in a given row and column does not have a corresponding contact point in a neighboring row in the given column or a corresponding contact point in a neighboring column in the given row.

The apparatuses and methods described herein provide many advantages over conventional cooling systems. The jet array employed in the present two-phase impingement system removes more thermal energy per unit of fluid flow and temperature difference than a single-phase impingement system. The two-phase system also maintains temperature uniformity better than a single-phase cooling system due to the phase change behavior. The non-perpendicularly angled tubular nozzles that impinge coolant streams non-perpendicularly on a surface offer optimum fluid flow and heat transfer compared with other heat transfer technologies, provide for more efficient use of coolant compared with perpendicularly oriented jet nozzles, allow for a more compact package, and provide for arrays of jets to be scaled to cover larger areas compared with jets and sprays embedded in a flat plate. The chambers described herein are much more compact than in spray cooling systems and require a much lower pressure drop across the inlet, leading to lower required pumping power. The system described herein does not require the use of a thermal interface material that a cold plate or other liquid-cooled heat sink might require, saving expense and lowering the environmental impact; does not require modification of the heated surface as micro-channel heat exchangers might require; and automatically manages arbitrarily located "hot spots" or regions of non-uniform thermal energy generation through locally enhanced evaporation.

The objects and advantages of the invention will appear more fully from the following detailed description of the preferred embodiment of the invention made in conjunction with the accompanying drawings.

DETAILED DESCRIPTION OF THE INVENTION

One aspect of the present invention involves cooling a surface with a liquid coolant wherein the coolant at least partially undergoes a phase change to a vapor at the surface. This is achieved by generating a flow of coolant at a pressure such that coolant contacting the surface reaches its saturation temperature for that pressure and thereby at least partially undergoes a phase change into a vapor (i.e., evaporates). Cooling in this manner both provides efficient thermal energy dissipation and automatically resolves issues with hot spots, as is discussed below.

As used herein, the general term "coolant" refers to any fluid capable of undergoing a phase change from liquid to vapor or vice versa at or near the operating temperatures and pressures of an apparatus as described herein. The term refers herein to the fluid in the liquid phase, the vapor phase, and mixtures thereof. A number of coolants may be selected for use within the apparatus described herein depending on cost and level of optimization desired. Non-limiting examples include water, HFE-7000, R245fa, FC-72, and FC-40. Other coolants are known in the art. Water is readily abundant and inexpensive. However, it does not change phase at a low temperature (such as 40° C. or 50° C.) without operating at very low pressures that can be difficult to maintain. In addition, water as a coolant requires a number of additives and absorbs a range of materials from the surfaces with which it comes into contact. During phase change, these materials may come out of solution, causing fouling or—other issues. Therefore, it is preferred that a pure dielectric fluid, such as HFE-7000 or R245fa, is used as a coolant. Such coolants are preferably used in direct contact with the processor package or surface. This eliminates the requirement for thermal interference materials between the coolant and the work piece to be cooled and thereby eliminates their associated resistances.

Some versions of the invention comprise maintaining coolant surrounding a surface at a pressure that establishes its saturation temperature to be slightly above the temperature of streams of coolant projected at the surface. As used herein, "maintaining" means holding at a constant value over a period of time. "Coolant surrounding a surface" refers to a steady state volume of coolant immediately surrounding and in contact with a surface, excluding streams of coolant projected directly at the surface, "Saturation temperature" is used herein as is it is commonly used in the art. The saturation temperature is the temperature for a given pressure at which a liquid is in equilibrium with its vapor phase. If the pressure in a system remains constant (isobaric), a liquid at saturation temperature evaporates into its vapor phase as additional thermal energy (heat) is applied. Similarly, a vapor at saturation temperature condenses into its liquid phase as thermal energy is removed. The saturation temperature can be increased by increasing the pressure in the system. Conversely, the saturation temperature can be lowered by decreasing the pressure in the system. In specific versions of the invention, a saturation temperature "slightly above" the temperature of streams of coolant projected at the surface refers to a saturation temperature of about 0.5° C., about 1° C., about 3° C., about 5° C. about 7° C., about 10° C., about 15° C., or about 20° C. above the temperature of coolant projected against the surface. Establishing a saturation temperature of coolant surrounding a surface slightly above the temperature of stream of coolant projected at the surface provides for at least a portion of the coolant projected at the surface to heat and evaporate after contacting the surface.

The appropriate pressure at which to maintain the coolant to achieve the preferred saturation temperatures can be determined theoretically by rearranging the following Clausius-Clapeyron equation to solve for $P_0$:

$$T_B = \left(\frac{R\ln(P_0)}{\Delta H_{vap}} + \frac{1}{T_0}\right)^{-1}$$

wherein:
$T_B$=normal boiling point, K
R=ideal gas constant, 8.3145 J·K$^{-1}$·mol$^{-1}$
Po=vapor pressure at a given temperature, atm
$\Delta H_{vap}$=heat of vaporization of the coolant, J/mol
To=given temperature, K
Ln=that natural logarithm to the base e.

In the above equation, the given temperature (To) is the temperature of coolant in contact with-and heated by-the surface. The normal boiling point (Tn) is the boiling point of the coolant at one (1) atmosphere. The heat of vaporization ($\Delta H_{vap}$) is the amount of energy required to convert or vaporize a saturated liquid (i.e., a liquid at its boiling point) into a vapor. As an alternative to determining the appropriate pressure theoretically, the appropriate pressure can be determined empirically by adjusting the pressure and detecting evaporation or bubble generation at a surface as shown in the examples.

Figure 1:
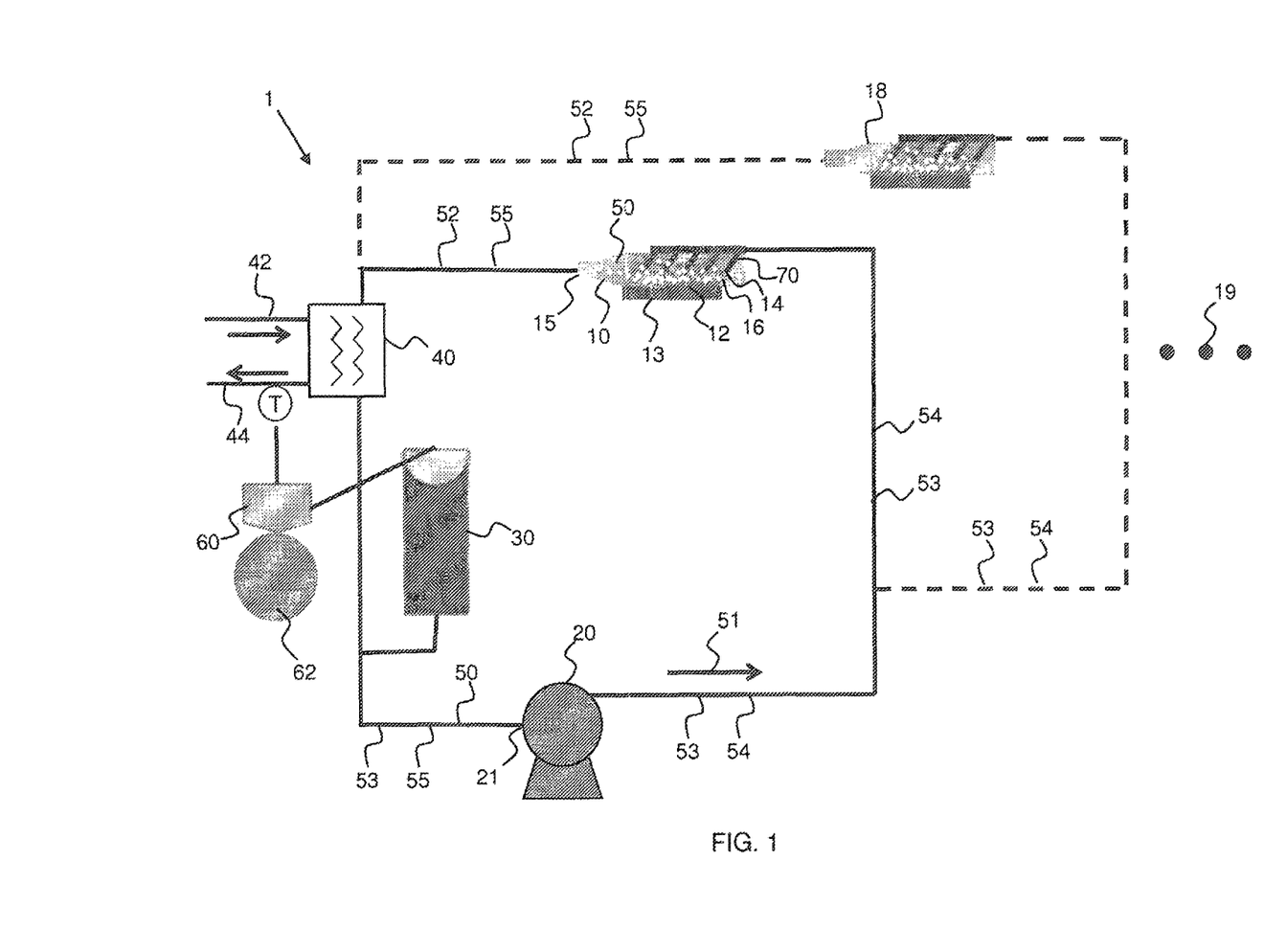
FIG. 1 depicts a schematic of an apparatus of the present invention for cooling a work piece surface.

Some versions of the invention comprise flowing a coolant through a chamber with the surface exposed therein at a pressure that promotes a phase change upon the coolant contacting-and being heated by-the surface. An exemplary apparatus I for performing such a method is shown in FIG. 1. The exemplary apparatus 1 includes a chamber 10 with a surface 12 to be cooled exposed therein, a pump 20, and a pressurizer 30, all in fluid communication. As used herein, "fluid communication" between two or more elements refers to a configuration in which fluid can be communicated between or among the elements and does not preclude the possibility of having a filter, flow meter, or other devices disposed between such elements. The elements comprising the apparatus 1 are preferably configured in a closed fluidic system, as shown in FIG. 1. However, in other versions, they may also be configured in an open system, wherein the pump 20 is disposed upstream of the chamber 10 and the pressurizer 30 is disposed downstream of the chamber 10. The apparatus 1 is capable of including one 18 or more 19 additional chambers in fluid communication with the pump 20 and pressurizer 30.

The chamber 10 includes one or more inlets 14 to permit fluid to inter the chamber 10 and one or more outlets 15 to permit fluid to exit the chamber 10. In this manner, the chamber 10 is configured to permit fluid to flow therethrough. The inlets 14 are preferably configured to project a stream 16 of a fluid, such as a coolant 50, against the surface 12. The stream 16 of fluid projected against the surface 12 is preferably a jet stream but may also be a spray stream. As used herein, a "jet" or "jet stream" refers to a substantially liquid fluid filament that is projected through a substantially liquid or fluid medium or a mixture thereof. "Jet" or "jet stream" is contrasted with "spray" or "spray stream," wherein "spray" or "spray stream" refers to a substantially atomized liquid fluid projected through a substantially vapor medium.

The surface 12 exposed within the chamber 10 preferably comprises a surface portion of a work piece 13, such that the streams 16 of coolant 50 impinge directly on the work piece 13 without thermal interference materials disposed between the work piece 13 and the coolant 50. As used herein, "work piece" refers to any electronic or other device having a surface that generates heat and that is desired to be cooled. Non-limiting, exemplary work pieces 13 include microprocessors, microelectronic circuit chips in supercomputers, or any other electronic circuits or devices requiring cooling such as diode laser packages. The surface 12 can be exposed within the chamber 10 by constructing the chamber 10 around the work piece 13 to include the surface 12 within the chamber 10.

The pump 20 is in fluid communication at least with the inlets 14 of the chamber 10 and is configured to force flow 51 of coolant 50 through the apparatus 1 and into the chamber 10 through the inlets 14. Any pump capable of generating a positive coolant 50 pressure to force the coolant 50 through the inlets 14 and against the surface 12 is suitable for use in the present invention. The pump 20 is preferably a variable speed positive displacement pump, such as a gear pump. An example includes the "MICROPUMP"-brand gear pump (Cole-Parmer, Vernon Hills, Ill.). A variable speed pump enables the flow 51 of coolant 50 to be set at a rate required to meet the expected heat load at the surface 12. In, place of or in addition to a pump 20, a reservoir of pressurized coolant 50 may be used.

The pressurizer 30 is a device capable of ensuring that the chamber 10 is maintained at a particular pressure. The pressurizer 30 is preferably in fluid communication with the chamber 10, such as the outlet 15 of the chamber 10, as well as the pump 20. The pressurizer 30 may be disposed anywhere on a low-pressure side of the, apparatus, i.e., between the pump 20 and the chamber 10 (see below), but is preferably close to the pump 20. In versions of the invention configured to project a jet stream 16 of coolant 50 against the surface 12, the pressurizer 30 is configured to ensure that the chamber 10 is filled with coolant 50 and to maintain the pressure of the coolant 50 in the chamber 10. In versions of the invention configured to project a spray stream 16 of coolant 50 against the surface 12, the pressurizer 30 is configured to maintain the vapor pressure in the chamber 10. In addition to determining the pressure in the chamber 10, the pressurizer 30 preferably maintains pressure of coolant 50 at an inlet 21 of the pump 20 at least slightly above the saturation pressure to prevent cavitation.

As used herein, "saturation pressure" is the pressure for a corresponding saturation temperature at which a liquid evaporates into its vapor phase. The pressurizer 30 further preferably maintains pressure in cases of significant vapor generation or "hot swapping" of components, the latter of which may add or decrease the amount of coolant 50 in the system.

In the preferred version, the pressurizer 30 comprises a pressurizing tank. The tank is preferably sized to accomplish any or each of the above functions. The tank may employ a bladder or may use a gas volume without a bladder. The pressurized gas volume, possibly separated from the liquid by a bladder, is maintained at a constant pressure by a pressure regulator 60. As the liquid volume in the tank changes, the gas volume changes to accommodate the change in liquid volume, with the pressure regulator 60 allowing gas into or out of the tank as necessary to maintain a constant pressure. The pressurizer 30 may also be implemented via a piston-cylinder apparatus. The piston in the piston-cylinder apparatus may be controlled by springs. Alternatively, the piston may be connected to a small, sealed reservoir containing vapor and saturated refrigerant at equilibrium. As the liquid level in the cylinder changes, the vapor volume in the small reservoir decreases or increases accordingly at constant pressure by evaporating or condensing. If the temperature of the refrigerant in the small reservoir changes, the pressure changes accordingly, which allows this device to be used as a temperature-controlled pressurizer. This concept is used in thermostatic valves for air conditioners and refrigerators. Yet other versions of pressurizers 30 include alternative tubing configurations. For example, valved bypass loops leading from the pump 20 to a position downstream of the chamber 10 may provide optional suction from the outlet 15 of the chamber 10 to decrease pressure within the chamber 10 when required. Alternatively or in addition, valved loops leading from a pump, such as pump 20, to the chamber 10 in a manner that bypasses the flow-restricted inlets 14 may provide increased delivery of coolant 50 to the chamber 10 to increase pressure when required.

The apparatus 1 preferably further includes a heat exchanger 40 in fluid communication with the chamber 10, pressurizer 30, and pump 20. The heat exchanger 40 is preferably disposed downstream of the chamber 10 and upstream of the pressurizer 30 and/or pump 20. "Downstream" and "upstream" are used herein in relation to the direction of flow 51 of coolant 50 within the apparatus 1. Inclusion of a heat exchanger 40 ensures that coolant exiting the chamber 10 is sufficiently cooled to below the saturation temperature established by the pressure within the chamber 10 before being recycled back into the chamber 10. A preferred heat exchanger 40 exchanges heat from the coolant 50 exiting the chamber 10 to an external cooling fluid 42,44 (reference 42 refers to non-heat-exchanged external cooling fluid, and reference 44 refers to heat-exchanged external cooling fluid). Any heat exchanger capable of cooling the coolant 50 to below the saturation temperature is acceptable. Non-limiting examples include shell-and-tube, plate, adiabatic-wheel, plate-fin, pillow-plate, fluid, dynamic-scraped-surface, phase-change, direct contact, and spiral heat exchangers. The heat exchanger 40 may operate by parallel flow or counter flow. The heat exchanger may also be designed to incorporate air as the second cooling fluid. This air-liquid heat exchanger may be a fin-and-tube or micro-channel implementation, among many other air-liquid heat exchangers known in the art. Yet another version of a heat exchanger includes piping providing fluid communication from the outlet 15 of the chamber 10 to the inlet 14 of the chamber, as well as the other components therebetween, wherein the piping or portions thereof is suitably configured to dissipate thermal energy of the fluid 50 flowing therethrough.

As shown In FIG. 1, any additional chambers 18 may be added to the device in parallel such that they are serviced by the same pressurizer 30, pump 20, and heat exchanger 40. Alternatively or in addition, the device may include additional pressurizers 30, pumps 20, and/or heat exchangers 40 in parallel for the purpose of redundancy or reliability. As used herein, an additional component "in parallel" refers to a component in fluid communication with the other components in a manner that bypasses only components of the same type without bypassing different types of components. An example of an additional component added in parallel is shown with the additional chamber 18 in FIG. 1, wherein the additional chamber 18 bypasses the chamber 10 without bypassing the pressurizer 30, pump 20, or heat exchanger 40.

An apparatus 1 as described above and shown in FIG. 1 has distinct, steady-state zones comprising coolant 50 at different temperatures and pressures. A zone comprising high-temperature coolant 52 includes the coolant surrounding the surface 12 within the chamber 10 (excluding the streams 16 of coolant 50 projected into the chamber 10) and extends downstream to the heat exchanger 40 (see FIG. 1 for direction of flow 51). The high-temperature coolant 52 is preferably at a temperature approximately equal to its saturation temperature. A zone of low-temperature coolant 53 extends from downstream of the heat exchanger 40 to at least the inlets 14 of the chamber 10 and includes the streams 16 of coolant 50 injected into the chamber 10. The low-temperature coolant 53 is preferably at a temperature slightly below the saturation temperature of the coolant 50 surrounding the surface 12, wherein "slightly below" may comprise about 0.5° C., about 1° C., about 3° C., about 5° C., about 7° C., about 10° C., about 15° C., about 20° C., or about 30° C. or more below the saturation temperature of coolant 50 surrounding the surface 12. The heat exchanger 40 serves to transition the high-temperature coolant 52 to low-temperature coolant 53, wherein the heat exchanger 40 transfers the difference in thermal energy between the high-temperature coolant 52 and the low-temperature coolant 53 to the non-heat-exchanged external cooling fluid 42, thereby generating heat-exchanged external cooling fluid 44. The surface 12 serves to transition the low-temperature coolant 53 to high-temperature coolant 52, wherein the surface 12 heats the coolant 50 contacting the surface 12 to the saturation temperature, thereby promoting evaporation.

A zone of low-pressure coolant 55 includes the coolant surrounding the surface 12 within the chamber 10 (which excludes the streams 16 of coolant 50 projecting into the chamber 10) and extends downstream to an inlet of the pump 21. The low-pressure coolant 55 is preferably at a pressure that promotes evaporation of coolant when heated at the surface 12. Therefore, the pressure of the low-pressure coolant 55 preferably determines a saturation temperature to be about equal to the temperature of the high-temperature coolant 52. A zone of high-pressure coolant 54 includes a portion downstream of the pump 20 and extends to at least the inlets 14 of the chamber 10. The high-pressure coolant 54 is preferably at a pressure suitable for generating streams of fluid 16 that contact the surface 12. The pump 20 serves to transition the low-pressure coolant 55 to high-pressure coolant 54, wherein the pump 20 applies a positive pressure against the flow-restricted inlets 14. The inlets 14 and the surface 12 serve to transition the high-pressure coolant 54 to low-pressure coolant 55, wherein the coolant 50 equilibrates to the pressure of the low-pressure coolant 55 after contacting the surface 12.

With the apparatus 1 as described above, a flow rate is set by the pump 20 to meet the expected heat load produced by the surface 12. A specific pressure for the low-pressure coolant 55 is set and maintained by the pressurizer 30 to establish a saturation temperature for the coolant surrounding the surface 12 to be slightly above the temperature of the low-temperature coolant 53. High-pressure 54, low-temperature 53 coolant is projected from the inlets 14 of the chamber 10 against the surface 12, whereby the coolant 50 undergoes a pressure drop upon equilibrating with fluid in the chamber 10 and also heats to the saturation temperature upon contacting the surface 12. The heated coolant undergoes a partial phase transition at the surface 12, which causes efficient cooling of the surface 12. The resulting low-pressure 55, high-temperature 52 coolant flows through the heat exchanger 40, where it is cooled to below the saturation temperature. This generates low-pressure 55, low-temperature 53 coolant. The low-pressure 55, low-temperature 53 coolant is then transitioned to high-pressure 54, low-temperature 53 coolant by virtue of the pump 20. The high-pressure 54, low-temperature 53 coolant is recycled back into the chamber 10.

In many practical applications, the external cooling fluid 42,44 flowing through the heat exchanger 40 is not held at a constant temperature due to varying heat load produced by the surface 12 or varying temperatures of ambient that exchanges heat with cooling fluid 42,44. With the above-described apparatus I, the pressure produced by the pressurizer 30 would therefore need to be set to a point corresponding to the warmest temperature expected for the high-temperature coolant 52 to prevent overheating of the surface 12 due to critical heat flux. However, setting the pressure according to the warmest temperature expected for the high-temperature coolant 52 would result in a phase change not occurring when the heat load of the surface 12 is not sufficient to heat the high-temperature coolant 52 to the warmest expected temperature. This leads to non-optimal cooling.

As shown in FIG. 1, a more efficient arrangement is to include a pressure regulator 60 that responds to the temperature of the heat-exchanged external cooling fluid 44 by modulating the pressure maintained by the pressurizer 30. The temperature or change in temperature of the heat-exchanged external cooling fluid 44 serves as an indicator of the temperature of the high-temperature fluid 52 and, thus, of the heat load of the surface 12. The pressure regulator 60 may include a device that detects the temperature or change in temperature of the heat-exchanged external cooling fluid 44. The pressure regulator 60 then communicates with the pressurizer 30 to adjust the pressure of the low-pressure coolant 55 to re-establish the saturation temperature. As the temperature of the heat-exchanged external cooling fluid 44 rises, the pressure regulator 60 increases the pressure set and maintained by the pressurizer 30 to increase the saturation temperature. Conversely, as the temperature of the heat-exchanged external cooling fluid 44 lowers, the pressure regulator 60 decreases the pressure set by the pressurizer 30 to decrease the saturation temperature. This regulation ensures that a phase change occurs at a variety of coolant 50 temperatures and prevents reaching the critical heat flux as a result of having the saturation temperature set at too Iowa value. The pressure regulator 60 may be aided by an air compressor 62. The air compressor 62 serves to create a reservoir of constant high pressure as a source of pressure for the pressure regulator 60. In some versions of the invention, the pressure regulator 60 may directly detect the temperature of the high-temperature coolant 52.

The apparatus I1 may further include a controller and a variable speed drive for the pump 20. See. e.g., U.S. Pat. Pub. 2006/0196627 to Shedd et al., incorporated herein by reference. These elements enable the pump 20 to operate at a lower power when the thermal load falls. The ability to operate at a lower power further conserves energy.

Figure 2:
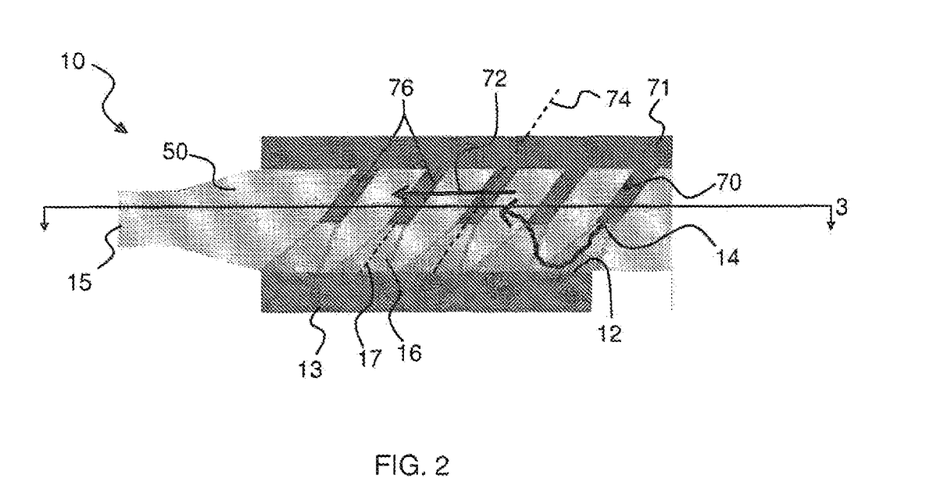
FIG. 2 depicts a side elevation cutaway view a chamber of the present invention comprising tubular nozzles directed non-perpendicularly at the surface and projecting a stream non-perpendicularly against the surface.

As shown in FIG. 2, the one or more inlets 14 of the chamber 10 preferably comprises one or more tubular nozzles 70 that extend into the chamber 10. The tubular nozzles provide a drainage path 72 through the chamber 10 to prevent exiting coolant from substantially interfering with the streams 16 projected from the inlet 14. This protects the incoming, streams 16 from the exiting, warm coolant. The tubular nozzles 70 and associated inlet manifold 71 may be made from a variety of materials selected for ease of manufacture and compatibility with the chosen coolant. They may even be injection molded to cut manufacturing costs significantly.

Each tubular nozzle 70 comprises a central axis 74 defined by the extended dimension of the tubular nozzle 70. The central axis of the tubular nozzle 74 may either be angled perpendicularly with respect to the surface 12 or angled non-perpendicularly with respect to the surface 12, the latter of which is shown in FIG. 2. If angled non-perpendicularly with respect to the surface 12, the central axis 74 may define any angle between 0° and 90° with respect to the surface 12, such as about 5°, about 10°, about 15°, about 20°, about 25', about 30°, about 35°, about 40°, about 45°, about 50°, about 55°, about 60°, about 65°, about 70°, about 75°, about 80° or about 85° or any range therebetween. The tubular nozzles 70 may comprise any cross-sectional shape when viewed along the central axis. Various versions include a circular shape, an oval shape (to generate a fan-shaped nozzle), and virtually any other cross-sectional shape.

The chamber 10 preferably includes an array 76 of tubular nozzles 70. The central axes 74 of the tubular nozzles 70 in the array 76 may define different angles with respect to the surface 12. A preferred arrangement is wherein the central axis 74 of each tubular nozzle 70 in the array 76 comprises the same angle with respect to surface 12, as shown in FIG. 2.

Figure 3:
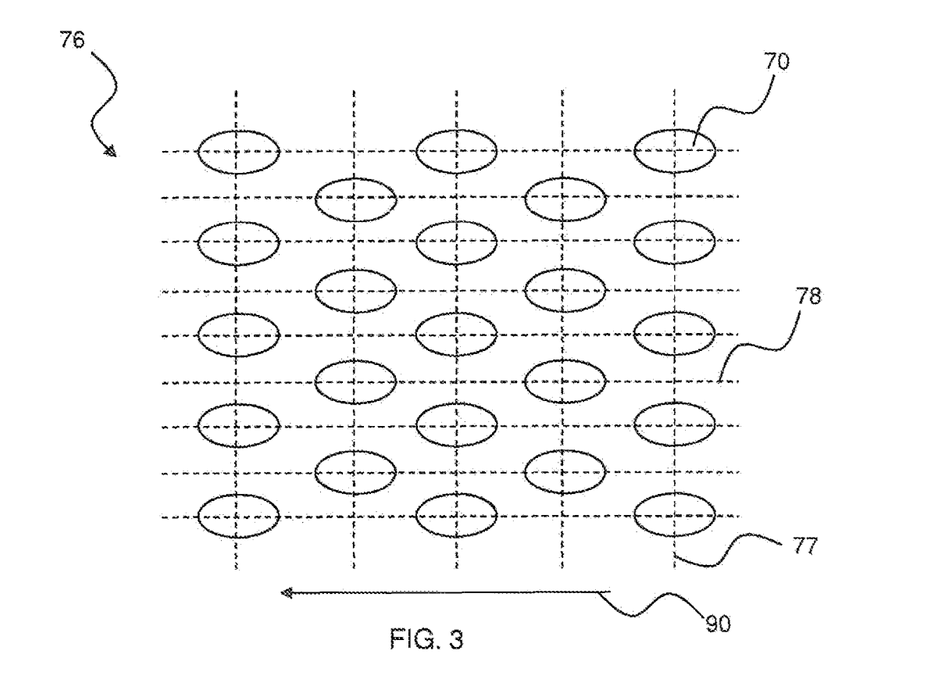
FIG. 3 depicts a top cutaway view of a portion of an array of tubular nozzles as taken from line 3 in FIG. 2.

The array of tubular nozzles 70 may be arranged in any configuration suitable for cooling the surface 12. In a version of the invention depicted in FIG. 3, the arrays 76 are organized into staggered columns 77 and rows 78. The staggering of tubular nozzles 70 in the array 76 is such that a given tubular nozzle 70 in a given column 77 and row 78 does not have a corresponding tubular nozzle 70 in a neighboring row 78 in the given column 77 or a corresponding tubular nozzle 70 in a neighboring column 77 in the given row 78. If the tubular nozzles 70 are configured to induce a substantially same direction of flow 90 along the surface 12 (see below), either the columns 77 or the rows 78 are preferably oriented substantially perpendicularly to the substantially same direction of flow 90. Arrays of tubular nozzles 70 in a non-staggered arrangement can also be used in the present invention.

The tubular nozzle 70 may be configured to project a stream 16 having any of a variety of shapes and any of a variety of trajectories. With regard to shape, the stream 16 is preferably a symmetrical stream. As used herein, "symmetrical stream," refers to a stream 16 that is symmetrical in cross section. Examples of symmetrical streams include linear streams, fan-shaped streams, and conical streams. Linear streams have a substantially constant cross section along their length. Conical streams have a round cross section that increases along their length. Fan-shaped streams have a cross section along their length with one cross-sectional axis being significantly longer than a second, perpendicular cross-sectional axis. In some versions of the conical streams, at least one and possibly both of the cross-sectional axes increase in length along the length of the stream. With regard to trajectory, the stream 16 preferably comprises a central axis 17 (see FIG. 2). For the purposes herein, the "central axis of the stream" is the line formed by center points of a series of transverse planes taken along the length of the stream 16, wherein each transverse plane is oriented to overlap with the smallest possible surface area of the stream 16, and each center point is the point on the transverse plane that is equidistant from opposing edges of the stream 16 along the transverse plane. In preferred versions, the tubular nozzle 70 projects a stream 16 having a central axis 17 that is substantially collinear with the central axis 74 of the tubular nozzle 70. However, the tubular nozzle 70 may also project a stream 16 having a central axis 17 that is angled with respect to the central axis 74 of the tubular nozzle 70. The angle of the central axis 17 of the stream 16 with respect to the central axis 74 of the tubular nozzle 70 may be any angle between 0° and 90°, such as about 1°, about 2°, about 3°, about 4°, about 5°, about 7°, about 10°, about 15°, about 20°, about 25°, about 30°, about 35°, about 40°, about 45°, about 50°, about 55°, about 60°, about 65°, about 70°, about 75°, or about 80° or any range therebetween. In such versions, the tubular nozzle 70 preferably projects a stream 16 wherein at least one portion of the stream 1 is projected along the central axis 74 of the tubular nozzle 70. However, the tubular nozzle 70 may also project a stream 16 wherein no portions of the stream 16 are projected along the central axis 74 of the tubular nozzles 70.

Similarly, the tubular nozzle 70 may be configured to project a stream 16 that impinges on the surface 12 at any of a variety of angles. In some versions, the tubular nozzle 70 projects a stream 16 at the surface 12 such that the entire stream (in the case of a linear stream), or at least the central axis 17 of the stream 16 (in the case of conical or fan-shaped streams), impinges perpendicularly on the surface 12 (i.e., at a 90° angle with respect to the surface). Perpendicular impingement upon a surface 12 induces radial flow of coolant 50 from contact points along the surface 12. While arrays 96 of perpendicularly impinging streams 16 are suitable for some applications, they are not optimal in efficiency. This is because opposing coolant flow from neighboring contact points interacts to form stagnant regions. Heat transfer performance in these stagnant regions can fall to nearly zero.

Figure 4:
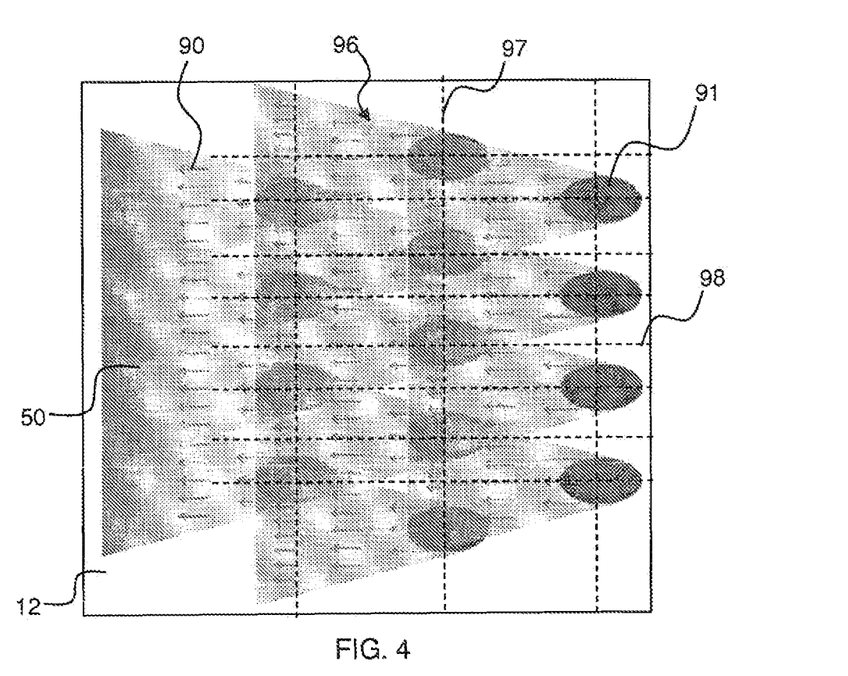
FIG. 4 depicts a top plan view of a surface upon which an array of streams impinges non-perpendicularly.

In a preferred version of the invention, the tubular nozzles 70 are configured to project a stream 16 that impinges on the surface 12 such that at least the central axis 17 of the stream 16, and more preferably the entire stream 16, impinges non-perpendicularly on the surface 12 (i.e, at an angle other than 90° with respect to the surface). As a non-limiting example, the central axis 17 of the stream 16 may impinge on the surface 12 at any angle between 0° and 90°, such as about 1°, about 2°, about 3°, about 4°, about 5°, about 7°, about 10°, about 15°, about 20°, about 25°, about 30°, about 35°, about 40°, about 45°, about 50°, about 55°, about 60°, about 65°, about 70°, about 75°, or about 80° or any range therebetween. FIG. 4 depicts a top plan view of a surface 12 on which each stream 16 of an array of streams impinges non-perpendicularly on the surface 12. Such impingement creates a flow pattern in which all the coolant 50 flows along the surface 12 in the substantially same direction 90. In some versions of patterns flowing in the substantially same direction 90, flow of coolant 50 at each portion of the surface 12 comprises a common directional vector component along a plane defined by the surface 12. In other versions, coolant 50 at no two points on the surface 12 flows in opposite directions. In yet other versions, coolant 50 at no two points on the surface 12 flows in opposite directions or flows in perpendicular directions. Flowing coolant 50 in the substantially same direction eliminates stagnant regions on the surface.

As further shown in FIG. 4, tubular nozzles 70 in the array 76 are preferably configured to impinge streams 16 on the surface 12 in an array 96 of contact points 91 comprising staggered columns 97 and rows 98. The staggering is such that a given contact point 91 in a given column 97 and row 98 does not have a corresponding contact point 91 in a neighboring column 97 in the given row 98 or a corresponding contact point 91 in a neighboring row 98 in the given column 97. If the coolant 50 is induced to flow across the surface 12 in a substantially same direction 90, as in FIG. 4, either the columns 97 or the rows 98 are preferably oriented substantially perpendicularly to the substantially same direction 90 of flow. Arrays 96 of contact points 91 arranged in this manner permit coolant 50 emanating from each contact point 91 in a given column 97 or row 98 to flow substantially between contact points 91 in a neighboring column 97 or row 98, respectively, as shown in FIG. 4. Even, consistent flow of coolant 50 over a surface 12 without stagnant regions 94 as provided by this configuration encourages bubble generation and evaporation whereby the heat transfer performance increases significantly.

A preferred version of the invention includes an array 76 of tubular nozzles 70 with each tubular nozzle 70 having a central axis 74 angled non-perpendicularly with respect to the surface 12, wherein each tubular nozzle 70 projects a stream 16 having a central axis 17 collinear with the central axis 74 of the tubular nozzle 70, and wherein all the tubular nozzles 80 have central axes 74 oriented at the same angle, project streams 16 having the same trajectory and shape, and impinge against the surface 12 at the same angle of impingement. The array 76 of tubular nozzles 70 is preferably further included in an apparatus 1 as illustrated and described with respect to FIG. 1. Such a preferred device optimally promotes bubble generation and evaporation at the surface, thereby achieving higher heat transfer performance than conventional impingement cooling systems, whether those systems are direct, using a dielectric fluid, or indirect, using a liquid coolant within a cold plate. Other implementations may promote bubble generation using structures within the tubular nozzles 70, such as structures that encourage cavitation or degassing of non-condensable gasses absorbed in the liquid.

The elements and method steps described herein can be used in any combination whether explicitly described or not. All combinations of method steps as described herein can be performed in any order, unless otherwise specified or clearly implied to the contrary by the context in which the referenced combination is made.

As used herein, the singular forms "a," "an," and "the" include plural referents unless the content clearly dictates otherwise.

Numerical ranges as used herein are intended to include every number and subset of numbers contained within that range, whether specifically disclosed or not. Further, these numerical ranges should be construed as providing support for a claim directed to any number or subset of numbers in that range. For example, a disclosure of from 1 to 10 should be construed as supporting a range of from 2 to 8, from 3 to 7, from 5 to 6, from 1 to 9, from 3.6 to 4.6, from 3.5 to 9.9, and so forth.

All patents, patent publications, and peer-reviewed publications (i.e., "references") cited herein are expressly incorporated by reference to the same extent as if each individual reference were specifically and individually indicated as being incorporated by reference. In case of conflict between the present disclosure and the incorporated references, the present disclosure controls.

The methods and compositions of the present invention can comprise, consist of, or consist essentially of the essential elements and limitations described herein, as well as any additional or optional steps, ingredients, components, or limitations described herein or otherwise useful in the art.

The parent application, U.S. application Ser. No. 13/169,377, was filed simultaneously with U.S. application Ser. No. 13/169,355 to Timothy A. Shedd, filed Jun. 27, 2011 entitled "Dual-Loop Cooling System," and now abandoned, the entirety of which is incorporated herein by reference.

It is understood that the invention is not confined to the particular construction and arrangement of parts herein illustrated and described, but embraces such modified forms thereof as come within the scope of the claims.

EXAMPLE

Many impingement technologies exist, but few have shown commercial promise and none have gained wide-scale commercial acceptance to date due to generally high flow rate requirements and limitations on scalability.

An improved impinging jet array apparatus has been developed and described herein. As described above, the current work has identified that angling the tubular nozzles and impinging the stream at a non-perpendicular angle with respect to the surface significantly improves the scalability of arrays of jets.

Figure 5A:
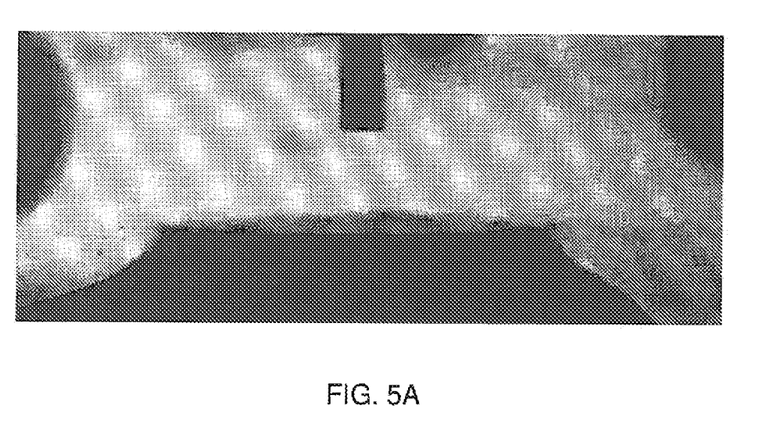
FIG. 5A depicts a chamber with coolant having a saturation temperature above the temperature of the coolant such that the coolant is not induced to vaporize.
Figure 5B:
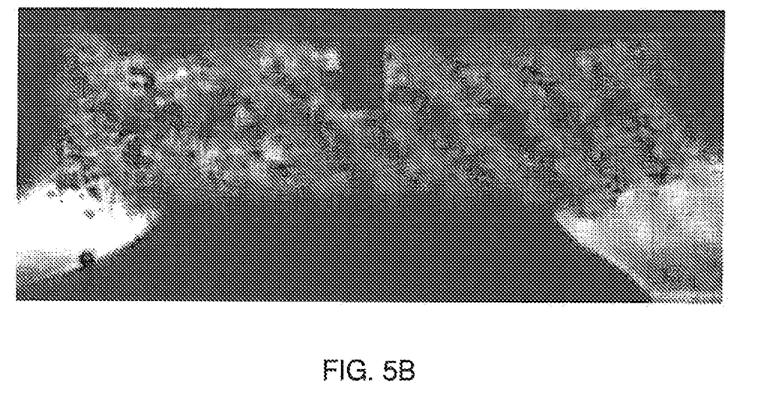
FIG. 5B depicts a chamber with coolant having a saturation temperature at about the temperature of the coolant such that the coolant is induced to partially vaporize.

In addition, laboratory tests have demonstrated that two-phase impinging jets can perform 80% to 100% better than single-phase jets with the same flow rate. A chamber comprising a tubular nozzle configured to project a jet impinging on a work piece surface was configured. The pressure in the chamber was set to establish a saturation temperature of either 95° C. (FIG. 5A) or 74° C. (FIG. 5B). The latter saturation temperature (74° C.) was chosen to substantially match the mean temperature of the heater surface in the test. The same flow rate was used for each saturation temperature. As shown in FIG. 5B, bubbles were generated in the chamber with the fluid having the lower saturation temperature. Such a phase change did not occur in the chamber with fluid having the higher saturation temperature (FIG. 5A). The heat transfer performance was increased by 80% with the lower saturation temperature compared to the higher saturation temperature.

A thermal resistance of 0.4 K/(W/cm$^2$) can be attained using HFE-71 00 and pressure drops across the inlets of less than 3 psi. It is anticipated that a thermal resistance of 0.3 K(W/cm$^2$) or lower will be achieved with optimization of impinging jet arrays and fluid management.

A benefit of this technology is the management of local hot spots, even down to the processor level. If just one core of a given processor is more heavily used than the others in the same processor, more vapor will be generated in the fluid impinging on that region of the surface, and the temperature will be maintained much more uniformly than what is possible with a single-phase cooling system.

The invention claimed is:

1. An apparatus for cooling a surface with a coolant, comprising:
   an enclosed chamber having an interior in communication with the surface, an inlet and an outlet, the inlet and the outlet being configured for flowing the coolant through the interior of the chamber against the surface and exiting the coolant through the outlet;
   a pump having an input in fluid communication with the outlet of the chamber through a first path and an output in fluid communication with inlet of the chamber through a second path, the pump configured to project the coolant through the inlet into the chamber and against the surface so as to cause the coolant to flow across the surface in a common flow direction;
   a pressurizer in fluid communication with the first path to adjust the pressure of the coolant flowing in the first path from the outlet of the chamber to the input of the pump; and
   a heat exchanger in the first path, the heat exchanger including an input in fluid communication with the outlet of the chamber and an output in fluid communication with the input of the pump, the heat exchanger configured to cool the coolant flowing along the first path;
   wherein:
   the inlet is defined by an array of nozzles, each nozzle in the array is configured to project a stream of coolant to a corresponding contact point on the surface;
   the contact points on the surface being arranged in staggered rows and columns;
   coolant emanates from each contact point so as to flow toward contact points in at least one of a neighboring column of contact points and a neighboring row of contact points;
   the heat exchanger has an external cooling fluid flowing therethrough;
   the external cooling fluid exiting the heat exchanger has a temperature; and
   the apparatus further comprises a pressure regulator responsive to the temperature of the external cooling fluid exiting the heat exchanger and operatively connected to the pressurizer, the pressure regulator causing the pressurizer to modulate the pressure of the coolant flowing in the first path in response to the temperature of the external cooling fluid exiting the heat exchanger.

2. The apparatus of claim 1 wherein at least a portion of the coolant projected against the surface has a temperature approximately equal to the saturation temperature of the coolant.

3. The apparatus of claim 1 wherein the pressurizer is configured to vary the saturation temperature of the coolant streamed through the inlet of the chamber to a desired level.

4. The apparatus of claim 1 wherein the pressurizer is selected from the group consisting of a bladder tank, a piston system, and a reservoir of temperature-controlled, mixed phase fluid.

5. The apparatus of claim 1 wherein:
   the array of nozzles includes first and second rows of nozzles;
   the first and second rows of nozzles are spaced along corresponding axes which are parallel to each other; and
   a first nozzle in the first row of nozzles is bisected by a first column axis which is co-planar with and perpendicular to the axis of the first row of nozzles;
   each nozzle of the second row of nozzles is bisected by a corresponding second row column axis which is perpendicular the axis of the second row of nozzles; and
   the first column axis is laterally spaced from and parallel to each of the second row column axis.

6. An apparatus for cooling a surface with a coolant, comprising:
   a chamber for receiving the surface therein, the surface communicating with an interior of the chamber, an inlet and an outlet, the inlet and the outlet being configured for flowing the coolant through the interior of the chamber against the surface and exiting the coolant through the outlet;
   a pump in fluid communication with the inlet of the chamber and being configured to project the coolant through the inlet into the chamber and against the surface so as to cause the coolant to flow across the surface in a common flow direction, the pump having an input in fluid communication with the outlet of the chamber through a first path and an output in fluid communication with the inlet of the chamber through a second path;
   a pressurizer configured to vary a saturation temperature of the coolant streamed through the inlet of the chamber to a desired level, the pressurizer in fluid communication with the first path and varying the saturation temperature of the coolant flowing in the first path by adjusting a pressure of the coolant flowing in the first path; and
   a heat exchanger in the first path, the heat exchanger including an input in fluid communication with the outlet of the chamber and an output in fluid communication with the input of the pump, the heat exchanger configured to cool the coolant flowing along the first path;
   wherein:
   the inlet is defined by an array of nozzles, each nozzle in the array is configured to project a stream of the coolant to a corresponding contact point on the surface;
   the contact points on the surface being arranged in staggered rows and columns;
   coolant emanates from each contact point so as to flow toward contact points in at least one of a neighboring column of contact points and a neighboring row of contact points;
   the heat exchanger has an external cooling fluid flowing therethrough;
   the external cooling fluid exiting the heat exchanger has a temperature; and
   the apparatus further comprises a pressure regulator responsive to the temperature of the external cooling fluid exiting the heat exchanger and operatively connected to the pressurizer, the pressure regulator causing the pressurizer to modulate the pressure of the coolant flowing in the first path in response to the temperature of the external cooling fluid exiting the heat exchanger so as to vary the saturation temperature of the coolant.

7. The apparatus of claim 6 wherein at least a portion of the coolant projected against the surface has a temperature approximately equal to the saturation temperature of the coolant.

8. The apparatus of claim 6 wherein:
   the array of nozzles includes first and second rows of nozzles;

the first and second rows of nozzles are spaced along corresponding axes which are parallel to each other; and a first nozzle in the first row of nozzles is bisected by a first column axis which is co-planar with and perpendicular to the axis of the first row of nozzles;

each nozzle of the second row of nozzles is bisected by a corresponding second row column axis which is perpendicular the axis of the second row of nozzles; and the first column axis is laterally spaced from and parallel to each of the second row column axis.

9. An apparatus for cooling a surface with a coolant, comprising:

a chamber having:
an interior communicating with the surface;
an array of inlets arranged in first and second rows in the chamber and directed at the surface, the first and second rows of inlets being are spaced along corresponding axes which are parallel to each other; and
an outlet;

a pump in fluid communication with the array of inlets and being configured to project coolant through the array of inlets into the chamber and against the surface so as to cause the coolant to flow across the surface in a common flow direction, the pump having an input in fluid communication with the outlet of the chamber through a first path and an output in fluid communication with the array of inlets of the chamber through a second path;

a pressurizer configured to vary a saturation temperature of the coolant streamed through the, array of inlets to a desired level;

a heat exchanger having an external cooling fluid flowing therethrough for cooling the coolant flowing through the first path, the external cooling fluid exiting the heat exchanger having a temperature; and a pressure regulator responsive to the temperature of the external cooling fluid exiting the heat exchanger and operatively connected to the pressurizer, the pressure regulator causing, the pressurizer to modulate the pressure of the coolant flowing in the first path in response to the temperature of the external cooling fluid exiting the hear exchanger so as to vary the saturation temperature of the coolant;

wherein:
a first inlet in the first row of inlets is bisected by a first column axis which is co-planar with and perpendicular to the axis of the first row of inlets;

each inlet of the second row of inlets is bisected by a corresponding second row column axis which is perpendicular the axis of the second row of inlets;

the first column axis is laterally offset and parallel to the second row column axes;

each inlet includes a corresponding nozzle for projecting a stream of the coolant to a corresponding contact point on the surface;

the contact points on the surface being arranged in staggered rows and columns; and coolant emanates from each contact point so as to flow toward contact points in at least one of a neighboring column of contact points and a neighboring row of contact points.

10. The apparatus of claim 9 wherein the pressurizer is in fluid communication with the first path, the pressurizer varying the saturation temperature of the coolant flowing in the first path by adjusting the pressure of the coolant flowing in the first path.

11. The apparatus of claim 9 wherein at least a portion of the coolant projected against the surface has a temperature approximately equal to the saturation temperature of the coolant.

* * * * *